United States Patent [19]

Pasch

[11] Patent Number: 5,436,411
[45] Date of Patent: Jul. 25, 1995

[54] FABRICATION OF SUBSTRATES FOR MULTI-CHIP MODULES

[75] Inventor: Nicholas F. Pasch, Pacifica, Calif.

[73] Assignee: LSI Logic Corporation, Milpitas, Calif.

[21] Appl. No.: 169,788

[22] Filed: Dec. 20, 1993

[51] Int. Cl.$^6$ .............................. H05K 1/00
[52] U.S. Cl. .................. 174/261; 174/250; 174/258
[58] Field of Search ............ 174/250, 255, 258, 261, 174/262, 263, 264, 265, 266; 361/754; 428/901

[56] References Cited

U.S. PATENT DOCUMENTS

| | | |
|---|---|---|
| 4,159,401 | 6/1979 | Kamata . |
| 4,708,770 | 11/1987 | Pasch . |
| 4,963,512 | 10/1990 | Iwanaga et al. . |
| 5,174,646 | 12/1992 | Siminovitch et al. . |
| 5,248,854 | 9/1993 | Kudoh et al. . |
| 5,266,746 | 11/1993 | Nishihara et al. . |

*Primary Examiner*—Leo P. Picard
*Assistant Examiner*—Cheryl R. Figlin

[57] ABSTRACT

Poor sidewall coverage of vias in substrates for multi-chip modules is alleviated by forming pillars associated with conductors on an underlying metal wiring layer. In one embodiment, the pillars are disposed underneath the conductors, causing portions of the conductors to be pushed up through an overlying insulating layer towards a metal layer overlying the insulating layer. The pillars can be electrically conductive or insulating, and can be thermally conductive. In another embodiment, the pillars are disposed atop the conductors, thereby extending at least partially through the insulating layer. These pillars are electrically conductive.

17 Claims, 7 Drawing Sheets

FABRICATION OF SUBSTRATES FOR MULTI-CHIP MODULES

TECHNICAL FIELD OF THE INVENTION

The invention relates to substrates for mounting and interconnecting one or more integrated circuit devices.

BACKGROUND OF THE INVENTION

Various substrates are known for mounting and connecting to integrated circuit devices. When two or more such integrated circuit devices are mounted to such a substrate, the resulting assembly is typically termed a "multichip module". As used herein, the term "multichip module" applies to situations where one or more integrated circuit devices are mounted to a substrate.

A printed circuit board (PCB) is an example of such a substrate, and has at least one layer of conductive lines for connecting to at least one integrated circuit device. Additional components may be mounted to the PCB. Often, the interconnections between the various components mounted to the substrate necessitate a large number of conductive lines (traces) which need to cross one another. In such cases, it is known to provide a multilayer substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes. In this manner, complex interconnection schemes can readily be effected. However, plated through-holes are a constant source of concern, from a reliability viewpoint. Further, the densities achievable using PCBs as a substrate are somewhat limited by the effective geometry of the conductive lines that can be applied to the various layer of the substrate.

Higher densities of interconnect can be achieved with a new class of substrates, such as are disclosed in U.S. Pat. No. 4,963,512. Like PCBs, these high-density substrates employ alternating conductive and insulating layers. Typically, these high-density substrates are based on polyimide insulating layers, and the conductor patterns are formed by electroless plating of an underlying conductive pattern atop a polyimide layer. Connections between conductors, from layer-to-layer, are effected by vias—a type of through-hole which is subsequently filled with a conductive material, such as by sputtering or in the same step as the next higher conductor layer is applied. These vias are formed through an insulating (e.g., polyimide) layer, which typically are on the order of tens of microns ($\mu$m) thick, and are consequently very difficult to fill reliably.

Another problem with multichip modules, whether PCB or polyimide film based, is that the integrated circuits mounted to the substrate are typically mounted "face-down". In other words, the circuit elements of the integrated circuit die are in close juxtaposition with the surface of the substrate. Hence, heat generated by these circuit elements, during operation of the die, is difficult to extract from the die. Various arrangements of mounting thermal masses to the back side (non-circuit-element side) of the die are known, but are clumsy and are of somewhat attenuated effectiveness. Simply stated, the substrate itself is in the way of any effective heat sinking element that can be placed in close juxtaposition to the front (circuit-element) side of the die. The difficulty of removing heat from dies operating in a multichip module causes difficulties in the reliability both of the die and of the substrate. Vis-a-vis the substrate, excess heat can cause delamination of the layers and/or failure of the layer-to-layer connections (through vias) of conductor lines.

Another issue in the formation of polyimide film type substrates is planarization of the various layers. This is similar, in type, to certain problems faced in the manufacture of semiconductor devices, albeit on an entirely different scale and requiring dissimilar processes for dissimilar materials than are applicable to and are found on dies. Briefly, as layer-upon-layer is formed on a substrate, topological irregularities (non-planarities) in one layer will manifest themselves, and in some cases augment themselves, in subsequent layers. This is antithetical to the goal of having a planar surface of the substrate for mounting an integrated circuit device. Techniques such as spinning-on polyimide to achieve a planar polyimide layer are known, and address this issue. An example of known techniques for forming a multilayer substrate for mounting integrated circuit devices is now described.

A first, conductive metal layer is deposited and patterned on the surface of an insulating layer, such as polyimide film. The patterned metal layer is coated with a thick dielectric layer, such as polyimide polymer, having a thickness on the order of 5–50 $\mu$m (microns). The dielectric layer is masked, by suitable means, and patterned by wet chemical etching or dissolution processes or dry plasma etching processes, to form vias extending through the dielectric layer to the underlying patterned metal layer. These vias can have rather steep (e.g., ninety degree) walls, and a subsequent, second metal layer (film) applied (deposited) over the dielectric (insulating) layer will have great difficulty in filling the vias and achieving good sidewall coverage in the vias. This poor via filling will be evident even if the angle of the sidewalls is reduced (e.g., to thirty or forty degrees). Generally, the phenomenon of "self-shadowing" of the metal deposition by the walls of the via causes poor metal step coverage at the base of the via, where the metal of the second metal layer contacts the metal of the first metal layer.

Generally, in the current state of the art in the production of such substrates for multi-chip modules (as well as single chip modules), the spacing between metal layers can exceed 10 $\mu$m. This creates substantial step coverage issues for the production of said modules and poor production yields as a result.

As mentioned hereinabove, certain issues (e.g., planarization) affecting substrates for multichip modules are similar in type to issues being addressed in the formation of the layers of a semiconductor die, but require solutions that are different in kind. For example, U.S. Pat. No. 4,708,770 discloses a planarized process for forming vias in silicon wafers.

DISCLOSURE OF THE INVENTION

It is therefore an object of the present invention to provide an improved technique for forming substrates for mounting and connecting integrated circuits.

It is a further object of the present invention to provide a technique for reducing the effective height of vias through insulating layers of a multilayer substrate.

It is a further object of the present invention to provide a technique for enhancing the fillability (e.g., step and sidewall coverage) of vias through insulating layers of a multilayer substrate.

It is a further object of the present invention to provide an inherent heat-sinking capability in multichip modules.

According to the invention, raised pillar structures can be formed in conjunction with a wiring layer (e.g., a first metal layer) of a wiring substrate (i.e., a substrate for flip-chip assembly, printed circuit board, or other similar planar "printed" wiring medium). The pillars are formed at the sites of subsequent connections to be made to a subsequent (e.g., second metal) layer to be formed over an insulating layer overlying the first metal layer. The pillars can be formed of insulating or conducting material. The pillars can be formed over or under a metal layer sought to be "pushed-up" into a subsequent via in an overlying insulating layer, thereby greatly facilitating connection from metal layer to metal layer in the multi-layer substrate.

In one embodiment, the pillars are disposed underneath the metal layer (e.g., the first metal layer), so that the conductive lines of the first metal layer are pushed up into vias subsequently formed in an insulating layer overlying the first metal layer. The pillar structures are formed by creating conductive or non-conductive raised structures on the surface of the substrate at the sites of (yet to be formed) connections between a first metal layer and a second metal layer, prior to depositing (or applying or plating or sputtering, etc.) the first metal wiring layer. The first metal layer is then formed over the raised structures, causing portions of the first metal layer to be "pushed-up" above the surface of the rest of the first metal layer. In the event that the raised pillar structures are thermally conductive, they can serve to aid in extracting heat from an operating die mounted to the completed substrate.

In another embodiment, the pillars are conductive, and are disposed atop the first metal layer and function as "plugs" extending into vias to be formed in the overlying insulating layer. The raised pillar structures are formed after forming the first metal wiring layer on the surface of the substrate. The first metal layer can be plated or sputtered metal, or can be a metal foil which is subsequently etched to form wiring patterns. At the sites of (yet to be formed) interconnections between the first metal wiring layer and a second metal wiring layer, conductive pillar structures are then formed. These conductive pillars can be formed by selective plating (e.g., repetitive build-up by plating), sputtering, screen printing (e.g., with metallized conductive epoxy or other suitable material), or by any other suitable technique, to created conductive structures which are electrically connected to the first metal layer.

Evidently, in the first embodiment portions of the metal layer itself are pushed-up towards a subsequent metal layer, and in the second embodiment it is the pillar structures themselves that push up into the overlying insulating layer towards a subsequent metal layer.

Generally, the multi-layer substrate can be formed on a rigid, or semi-rigid underlying (typically insulating) substrate, which can be a printed circuit board substrate (e.g., FR4 or BT resin), or a substrate for very-high-density wiring, such as polyimide.

According to an aspect of the invention, the top surfaces of pillar structures disposed atop a wiring layer can be "polished" or otherwise processed, as desired, to ensure their coplanarity.

According to an aspect of the invention, the height of the pillar structures is established so that their tops are exposed after forming the insulating layer between the two metal layers.

Alternatively, the height of the pillar structures is established so that their tops are flush with the top surface of the insulating layer between the two metal layers.

Alternatively, the height of the pillar structures is established so that their tops are below the top surface of the insulating layer between the two metal layers. This, of course, requires vias, albeit very shallow, to be formed in the insulating layer to expose the tops of the pillar structures, prior to forming the overlying metal layer.

For pillar structures formed under pushed-up portions of the first wiring layer, the height of the pillar structures can similarly be set such that the pushed-up portions of the wiring layer extends above, flush with, or below the surface of the insulating layer formed between the two metal layers.

The techniques for pushing up conductors from a first wiring layer towards a second wiring layer can be applied to any (and to all) two adjacent conductive layers in a substrate for multi-chip modules.

Other objects, features and advantages of the invention will become apparent in light of the following description thereof.

DETAILED DESCRIPTION OF THE INVENTION

Figure 1A:
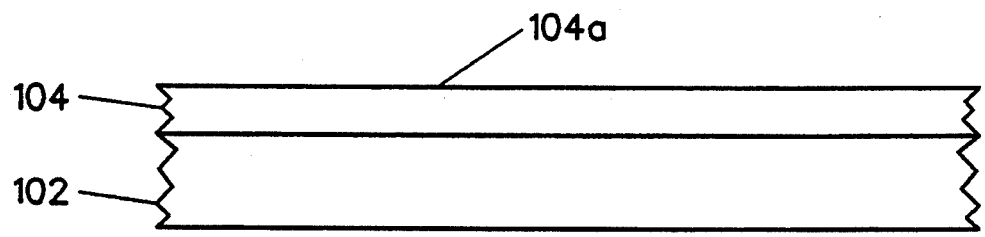
FIGS. 1a–1f are cross-sectional views of a substrate for flip-chip assembly, according to the invention, at various stages of processing.

According to the invention, raised pillar structures are formed in conjunction with a first metal layer (a wiring layer) of a wiring substrate (i.e., a substrate for flip-chip assembly, printed circuit board, or other similar planar "printed" wiring medium) at the sites of connections to a second metal layer which will be formed overlying and insulated from the first metal layer. The raised pillar structures effectively push-up the first metal layer, or extend up from the first metal layer, so that subsequent connections to the subsequently formed second metal layer overlying the insulating layer are facilitated.

The first metal layer is formed on an insulating layer, which may be a distinct layer, or a layer applied to an underlying support substrate such as a printed circuit board substrate (e.g., FR4 or BT resin), or a substrate for very-high-density wiring, such as polyimide. The initial insulating layer (or support substrate) provides a firm mechanical backing and support for subsequent metal layers and insulating layers, as well as providing a mechanical structure for supporting semiconductor dies which will be mounted to the completed wiring substrate.

The pillar structures themselves can be formed by one of two basic techniques. In a first technique, conductive or non-conductive raised structures are formed on the surface of the substrate at the sites of (yet to be formed) connections between a first metal layer and a second metal layer, prior to depositing (or applying or plating or sputtering, etc.) the first metal wiring layer. The first metal layer is then formed over the raised structures, causing portions of the first metal layer to be "pushed-up" above the surface of the rest of the first metal layer in the form of raised conductive pillars. The top surfaces of the pillars can (optionally) be "polished" or otherwise processed, as desired, to ensure coplanarity. The first metal layer can be plated or sputtered metal, or can be a metal foil applied over the substrate and pillars which is subsequently etched to form wiring patterns.

The second technique for forming the raised conductive pillars forms conductive pillars after a first metal wiring layer is deposited (or otherwise formed). The first metal wiring layer is deposited (or otherwise disposed or formed) on the surface of the substrate. The first metal layer can be plated or sputtered metal, or can be a metal foil which is subsequently etched to form wiring patterns. At the sites of (yet to be formed) interconnections between the first metal wiring layer and a second metal wiring layer, raised conductive pillars are formed. These conductive pillars can be formed by selective plating (e.g., repetitive buildup by plating), sputtering, screen printing (e.g., with metallized conductive epoxy or other suitable material), or by any other suitable technique, to created conductive structures which are electrically connected to the first metal layer.

Regardless of which of the two basic techniques is used to form the raised pillar structures, the subsequent processing steps proceed in much the same fashion. An insulating layer is disposed over the first metal layer and pillar structures. The thickness of the insulating layer can be such that:

1) the insulating layer surrounds and covers most of the sides of the raised pillar structures, but does not cover the tops of the pillar structures;
2) the surface of the insulating layer is just flush with the tops of the raised pillar structures; or
3) the insulating layer completely surrounds and covers the raised pillar structures.

In the first case (insulating layer below tops of pillar structures), a subsequent step is employed to polish or etch back the tops of the pillar structures until they are at least flush with the surface of the insulating layer. Alternatively, the tops of the pillars can be left extending above the surface of the insulating layer. In the second case (insulating layer flush with tops of the pillar structures) an optional polishing step can be performed to ensure planarity of the surface. In the third case (insulating layer completely covers the pillar structures) one of two subsequent steps can be performed. The insulating layer can be polished or etched back until the tops of the pillar structures are exposed, or holes can be etched in the surface of the insulating layer at the sites of the pillar structures to expose the tops of the pillar structures.

After preparing the insulating layer (and pillars) as described above, the second metal layer (wiring layer) is deposited over the insulating layer and the tops of the pillar structures, (e.g., by plating or by sputtering). Depending upon the previous steps, the tops of the pillar structures will be either raised above, flush with, or recessed below the surface of the insulating layer. In any case, the deposited second metal layer will contact the tops of the pillar structures at points where it intersects with them, thereby forming electrical connections between the first and second metal layers via the conductive pillars.

Without the pillars, it would be necessary to form holes in the insulating layer (e.g., case 3, but deeper) and to completely fill them with metal, in a separate step or from the second metal layer, in order to form electrical connections from the second metal layer to the first metal layer. As discussed hereinabove, this presents numerous technical difficulties and is extremely disadvantages. With the pillars, however, the vertical extent of metallic "fill" required of the second metal layer is either dramatically reduced or eliminated entirely, effectively eliminating the aforementioned technical problems.

When metallic raised structures (either below or above the first metal layer) are used to form the pillar structures, the thermal mass of the metallic conductors provides for conduction of heat away from the semiconductor die and reduces localized heating (due to current flow) at the inter-layer connections within the wiring substrate. (This is also true to some extent when any good conductor of heat is used, whether or not it is an electrical conductor, although electrical non-conductors can permit localized current-based heating of connections.) This is especially advantageous for power supply connections to dies (which tend to carry the most current of any wiring substrate to die connections). Typically, a number of parallel power supply connections are formed to a semiconductor die. Assuming that all of these connections are formed via raised conductive pillars of the type described hereinabove and that all common connections to a single power supply voltage are made via a distribution "plate" (large planar conductor connected in common to all of the electrical distribution points) the thermal conductivity of the conductive pillars can aid greatly in removing heat from the die.

It will readily be appreciated by one of ordinary skill in the art that the technique described hereinabove for forming connections between a first metal wiring layer and a second metal wiring layer using pillar structures can be applied equally effectively between any two adjacent (sequential) wiring layers in a wiring substrate.

FIGS. 1a–1f are cross-sectional view of a wiring substrate for a multi-chip module, at various steps in the process of manufacturing the wiring substrate.

FIG. 1a shows a rigid substrate support 102 covered with an insulating layer 104 to be used as the basis for the wiring substrate. (The support 102 is optional.) The surface 104a of the insulating layer 104 is highly planar, and supports all subsequent layers. The rigid material 102 can be any suitable material, e.g., FR4 or BT resin for printed circuit substrates, or polyimide for high-density wiring substrates. The subsequent planar insulating layer 104 can be deposited over the rigid material as a spun-on film or otherwise deposited film of, e.g., polyimide, or other suitable insulating material. In the event that the rigid base material 102 is an insulating material and can be made sufficiently planar, the insulating layer 104 may not be required, in which case the subsequent layers can be built on the surface of the base material 102.

Figure 1B:
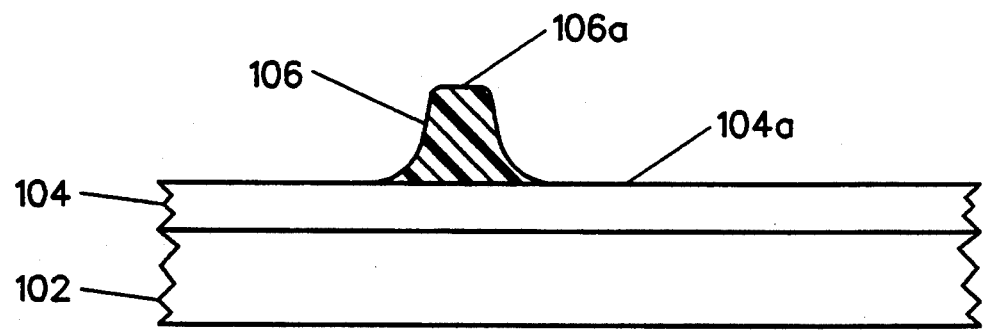

FIG. 1b shows one of many raised pillars 106 formed on the surface 104a of the insulating layer 104 at sites of (yet to be formed) connections between a first metal wiring layer and a second metal wiring layer. Optionally, the tops of the pillar can be polished, or the like, to ensure that their top surfaces 106a are all at the same height above the layer 104. The pillar 106 can be formed of a conducting (e.g., aluminum, copper) or a non-conducting (e.g., polyimide) material. Preferably, the pillar 106 is formed of a material which is a good conductor of heat, regardless of its electrical conductivity characteristics, in order that it may serve an additional function of drawing heat away from a die to be mounted to the multi-layer substrate. Such thermal masses (i.e., thermally-conductive pillar structures) embedded (as will be seen) in the multi-layer substrate can also function as heat spreaders to minimize local heating at numerous points throughout the multi-layer substrate.

Figure 1C:
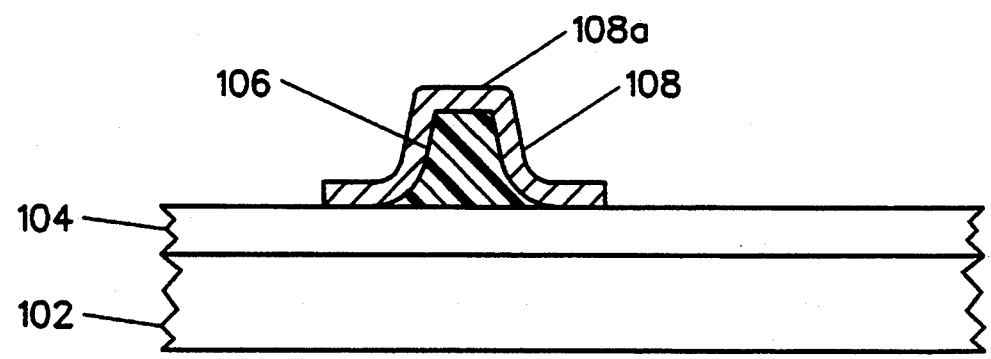

FIG. 1c, shows a metallic layer 108 (one of many conductive lines) formed over the pillar structure 106. The metal layer 108 is formed in any suitable manner, such as by plating, sputtering, or can be deposited as a foil and subsequently etched to form wiring conductors. It is well established and understood by those of ordinary skill in the art that sputtering or plating metal over raised surfaces (e.g., the raised surface of the pillar) is easy to accomplish and poses no particular difficulty. On the other hand, depositing metal into deep holes presents great difficulties. The surface of the metal layer 108 follows the contour of the pillar 106, having pushed-up portions extending upward from the remainder of the layer. A top surface 108a of the pushed-up portion of the conductor is indicated at a given height above the surface of the layer 104. The top surface 108a can optionally be polished or otherwise processed to ensure co-planarity between all such pushed-up portions and/or to control its height.

Figure 1D:
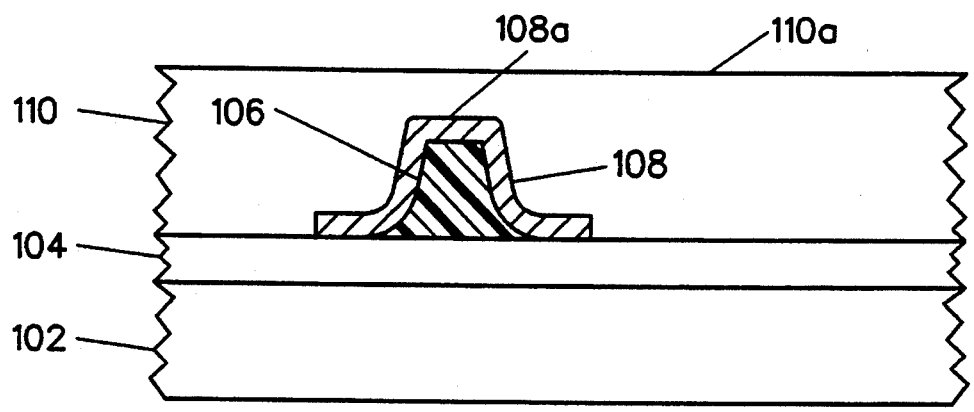

FIG. 1d shows the wiring substrate after formation of an insulating layer 110 surrounding and covering the metal wiring layer 108 and pillars 106. As depicted in the FIG., the tops 108a of the pushed-up portions of the conductors 108 are completely covered by the top surface 110a of the insulating layer 110. The insulating layer can be formed from any suitable insulating material, such as a spun-on film of polyimide (for high-density wiring substrates) or FR4 or BT resin (for more "conventional" printed circuit wiring substrates).

Figure 1E:
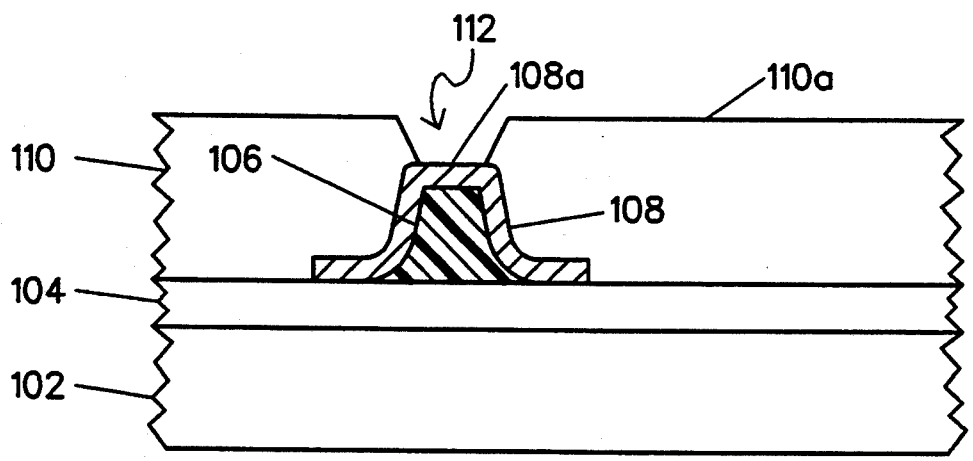

In the view shown in FIG. 1e, a hole (shallow via) 112 is formed in the planar top surface 110a of the insulating layer 110. The hole 112 extends into the insulating layer 110 to expose the top surface 108a of the previously-formed pushed-up portion of the conductor 108.

Figure 1F:
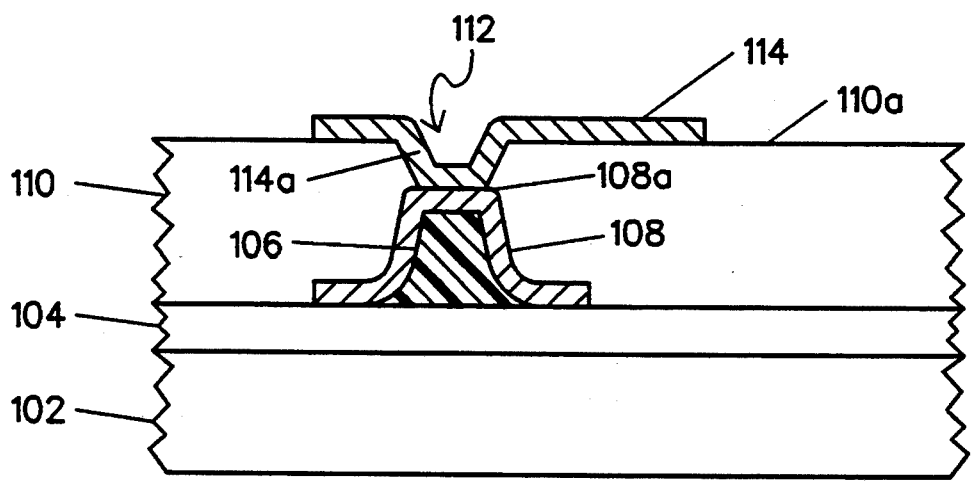

FIG. 1f shows a second metal wiring layer 114 formed on the surface 110a of the insulating layer 110 and extending into the hole 112 to (electrically) contact the top surface 108a of the pushed-up portion of the conductor 108. In this manner, an electrical connection is formed between the first wiring layer 108 and the second wiring layer 114. As discussed hereinabove, there are a number of alternative techniques which can be substituted for the techniques shown in FIG. 1d-1f. These techniques will be discussed in greater detail hereinbelow.

FIGS. 1a-f are illustrative of a first embodiment of the invention, and suitably employs pillar structures which are electrically conductive, thermally conductive, or relatively non-conductive (i.e., of electricity or heat). As is well illustrated in FIG. 1f, the hole 112, required to be formed to effect interconnection of the two wiring layers, is substantially shallower than a via that otherwise (without the pillar structure) would need to be formed through the insulating layer 110 to effect interconnection of the two conductive layers. Hence, such a shallower hole is easier to fill than a deeper via, and robust interconnections between wiring layers in a substrate for multi-chip modules are effected.

FIG. 2a-2f illustrate an embodiment where the pillar structures are formed atop, rather than below, the first wiring layer.

Figure 2A:
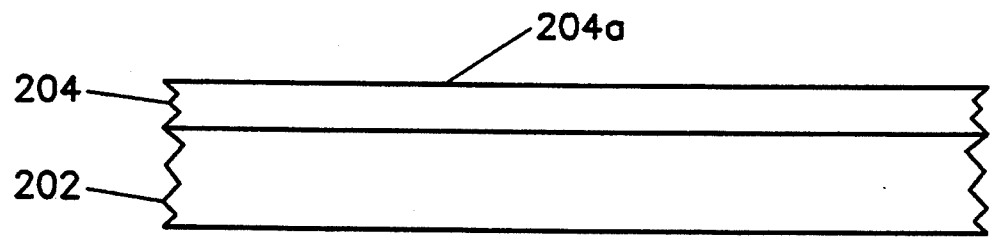
FIGS. 2a–2f are cross-sectional views of another embodiment of a substrate for flip-chip assembly, according to the invention, at various stages of processing.

FIG. 2a is similar to FIG. 1a, and shows a support layer 202 covered by an insulating layer 204, either of which may be used alone as the foundation of a substrate for multi-chip modules of various types (polyimide, PCB, or the like).

Figure 2B:
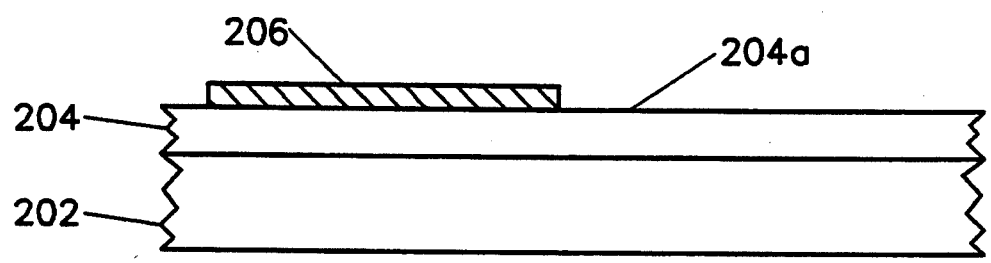

FIG. 2b shows a first metal wiring layer 206 deposited over the surface 204a of the insulating layer 204. The first metal wiring layer 206 can be formed in any suitable manner, such as by plating or sputtering metal or, in the case of PCB type substrates, can be an etched metal foil layer.

Figure 2C:
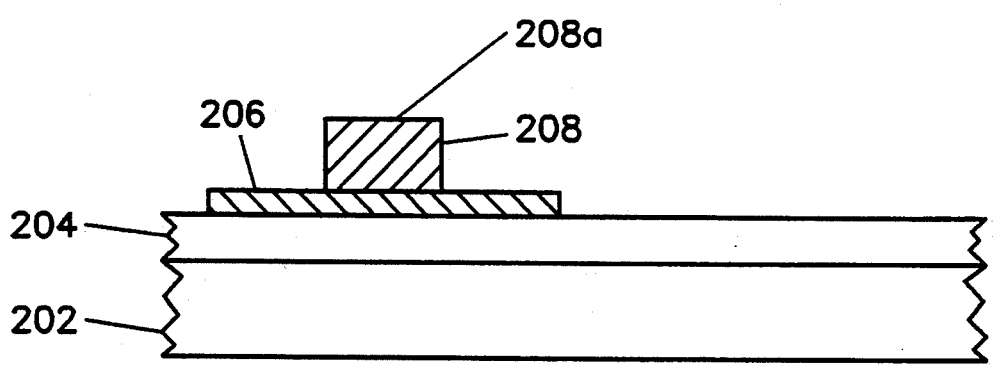

FIG. 2c shows one of a plurality of pillar structures 208 formed on top of the first metal wiring layer 206, at the future site of an interconnection between the first metal wiring layer and a (yet to be formed) second metal wiring layer. Optionally, the top 208a of the conductive pillar can be polished or otherwise processed to planarize it or to control the height of the pillar structure 208. The pillar structure 208 can be formed by plating (e.g., repetitive plate-up), sputtering, or screen printing (e.g., a metallized conductive epoxy, or other printable conductor). As will become evident, the pillar structure 208 should be electrically-conductive.

Figure 2D:
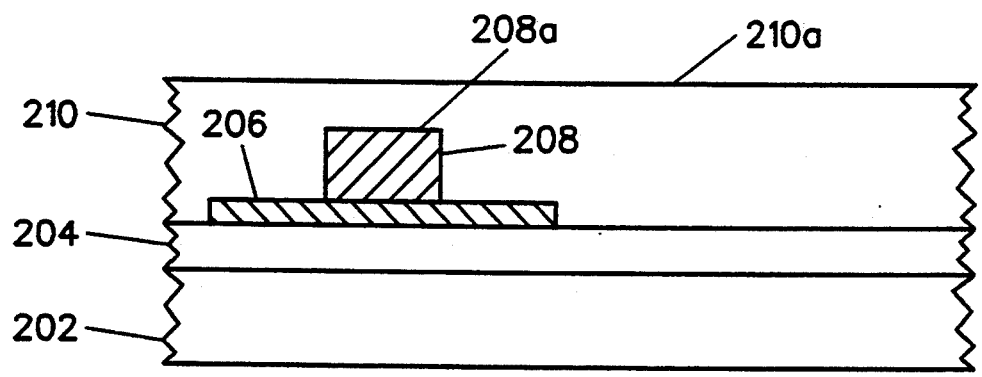
Figure 2E:
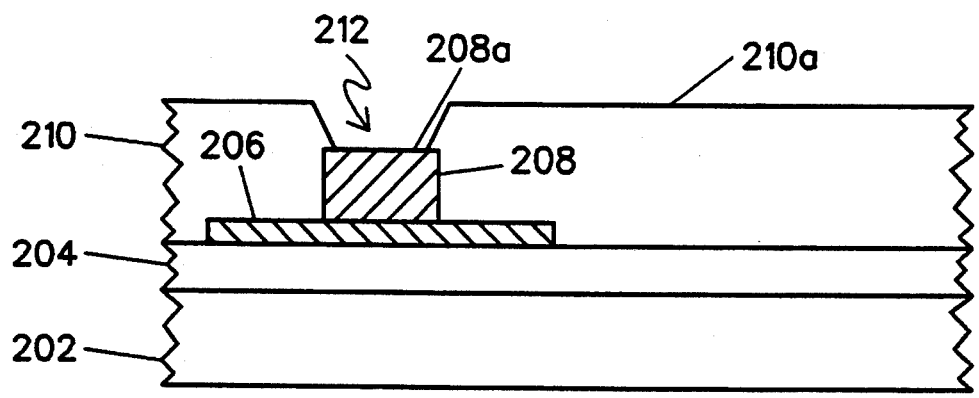
Figure 2F:
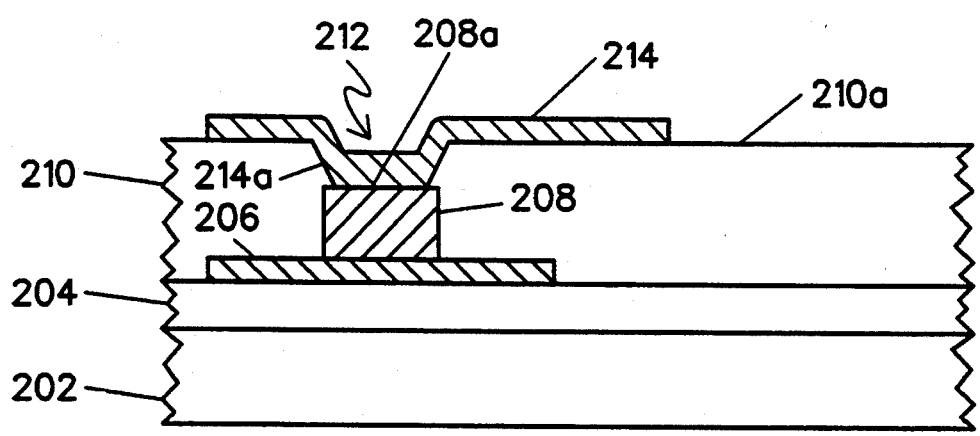

FIGS. 2b and 2c represent the major departure of the technique of this embodiment from the technique of the previous embodiment (FIGS. 1a-1f). At this point, the raised conductive pillar structures have been formed. Subsequent processing steps described with respect to FIGS. 2d-f are substantially identical to those described hereinabove with respect to FIGS. 1d-f. Alternatives to these processing steps will be discussed in greater detail hereinbelow.

FIG. 2d shows the wiring substrate after formation of an insulating layer 210 surrounding and covering the metal wiring layer 206 and pillars 208. The tops 208a of the pillar structures 208 are completely covered by the top surface 210a of the insulating layer 210. The insulating layer can be formed from any suitable insulating material, such as a spun-on film of polyimide (for high-density wiring substrates) or FR4 or BT resin (for more "conventional" printed circuit wiring substrates).

In the view shown in FIG. 2e, a hole (shallow via) 212 is formed in the planar top surface 210a of the insulating layer 210. The hole 212 extends into the insulating layer 210 to expose the top surface 208a of the previously-formed raised conductive pillar.

FIG. 2f shows a second metal wiring layer 214 deposited over the surface 210a of the insulating layer 210 and extending into the hole 212 to contact the top surface 208a of the pillar structure. In this manner, an electrical connection is formed between the first wiring layer 206 and the second wiring layer 214.

FIGS. 1a–1f and 2a–2f illustrate complete processes for forming interconnections between wiring layers in a wiring substrate. The difference between the two processes (i.e., the techniques shown in FIGS. 1a–1f and the techniques shown in FIGS. 2a–2f) is the position of the pillar structures vis-a-vis the first (or any) metal layer sought to be pushed-up. In FIGS. 1a–1f, portions of the metal layer itself are pushed up towards the next metal layer. In FIGS. 2a–2f, the pillar structures themselves effectively push themselves up towards the next metal layer. The technique by which the insulating layer between the two metal layers sought to be interconnected is formed, and the technique by which the overlying (second) metal layer is formed and interconnected to the underlying (first) metal layer are similar for either pillar technique. In both FIGS. 1a–1f and 2a–2f, the pushed-up conductor portion or pillar atop conductor was buried in the insulating layer (110, 210), requiring the formation of shallow vias (112, 212) to effect interconnection between the second metal layer and the first metal layer. Alternatives to having the pushed-up portions of the first metal layer, or pillars atop the first metal layer being buried in the insulating layer are also contemplated.

Figure 3A:
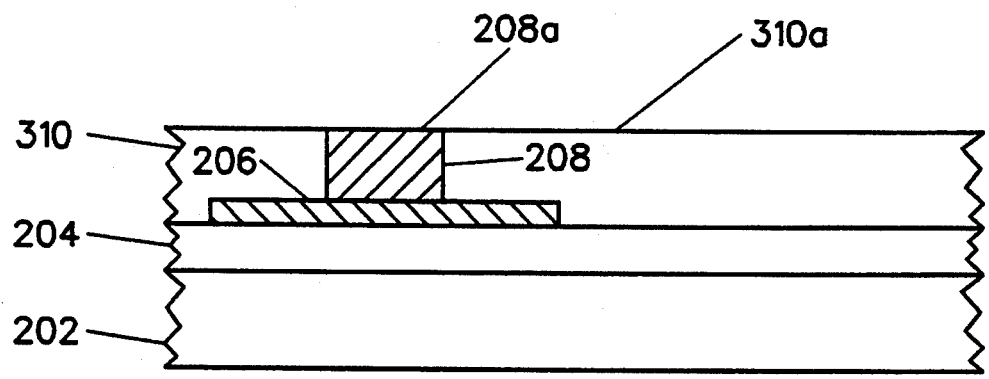
FIGS. 3a and 3b are cross-sectional views of a substrate for flip-chip assembly, according to the invention, illustrating an alternative to the views shown in FIGS. 2e and 2f.
Figure 3B:
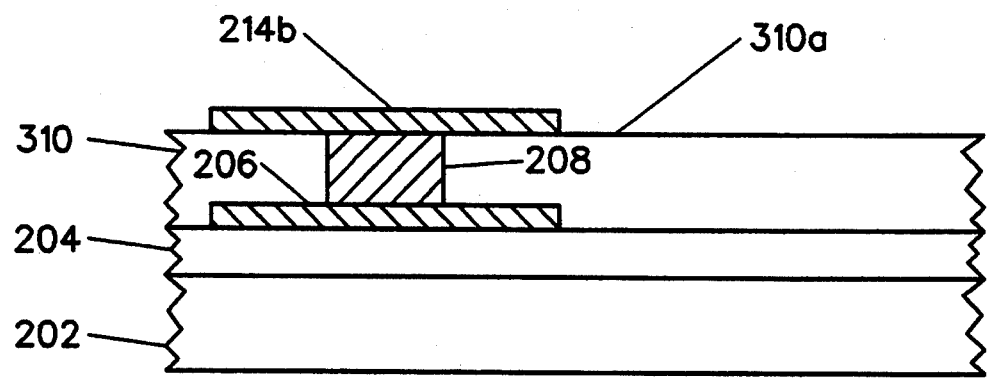
Figure 3C:
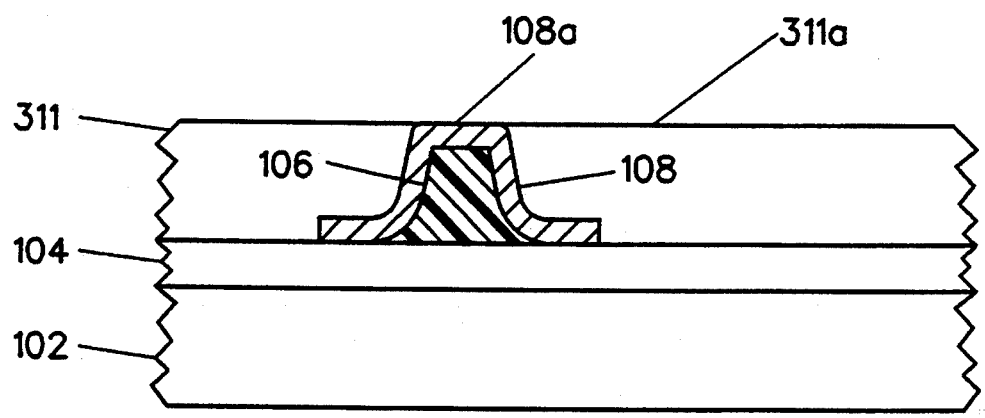
FIGS. 3c and 3d are cross-sectional views of a substrate for flip-chip assembly, according to the invention, illustrating an alternative to the views shown in FIGS. 1e and 1f.
Figure 3D:
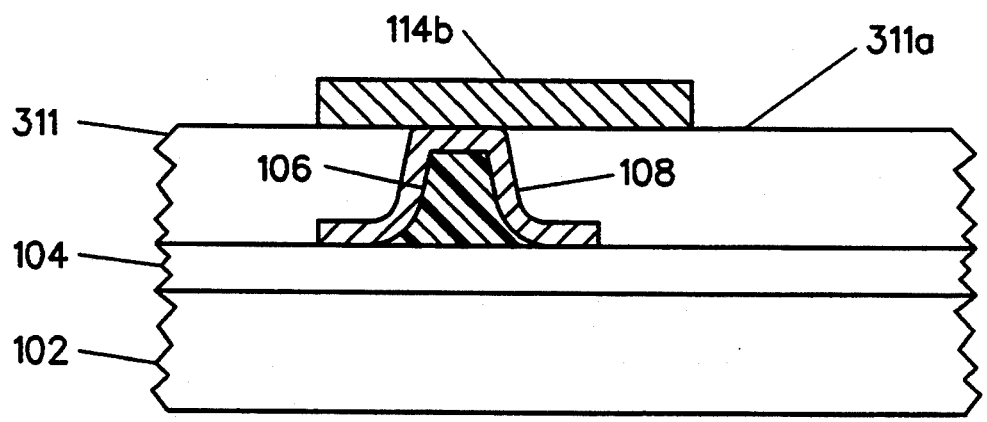

FIGS. 3a–3d illustrate an alternative approach to the techniques depicted in FIGS. 1d–1f and 2d–2f. FIGS. 3a and 3b show a technique where the tops of the pillar structures (208a, FIGS. 2a–f) and the top of the insulating layer are formed flush with one another. FIGS. 3c and 3d show the same technique applied to the embodiment of FIGS. 1a–1f. In other words, in FIGS. 3a–3d, the tops of the pillars over metal, or the tops of the pushed-up metal portions, are made flush with the top of the insulating layer between the metal layers, obviating the need for a hole (112, 212).

FIG. 3a shows the wiring substrate of FIG. 2c after formation of an insulating layer 310 over the first wiring layer and surrounding the raised pillar structure 208. The top surface 310a of the insulating layer 310 is formed flush with the top 208a of the pillar structure 208. This can be accomplished in one of several ways. A first method is to form the insulating layer 310 in a manner similar to that shown in FIG. 2d, where the insulating layer (210, FIG. 2d, 310 this Figure) extends completely over the top 208a of the pillar structure 208. The insulating layer 310 can then be polished or etched back until it is flush with the top 208a of the pillar structure 208. A second method to form the flush top effect is to form the insulating layer 310 such that it does not reach the top 208a of the pillar structure 208 and then to polish (or etch) the top 208a of the pillar structure back until it is flush with the surface 310a of the insulating layer 310 as shown in FIG. 3a. A third method is to ensure that the top 208a of the pillar structure 208 is coplanar with the tops of all other pillar structures, then to form the insulating layer to a height which is just flush with the tops of the pillar structures.

FIG. 3b shows a second metal wiring layer 314a formed over the surface 310a of the insulating layer and contacting the top (208a) of the pillar structure 208, establishing an electrical connection therebetween.

FIG. 3c shows the wiring substrate of FIG. 1c after formation of an insulating layer 311 over the first wiring layer and surrounding the raised portion of the conductor 108. This technique is substantially identical to that shown and described hereinabove with respect to FIG. 3a, but applies to the embodiment shown in FIGS. 1a–1f. The top surface 311a of the insulating layer 311 is formed flush with the top 108a of the raised portion of the conductor 108. This can be accomplished in a number of ways similar to those described hereinabove with respect to FIG. 3a.

FIG. 3d shows a second metal wiring layer 314b formed over the surface 311a of the insulating layer and contacting the top 108a of the raised portion of the conductor 108, establishing an electrical connection therebetween.

Figure 4A:
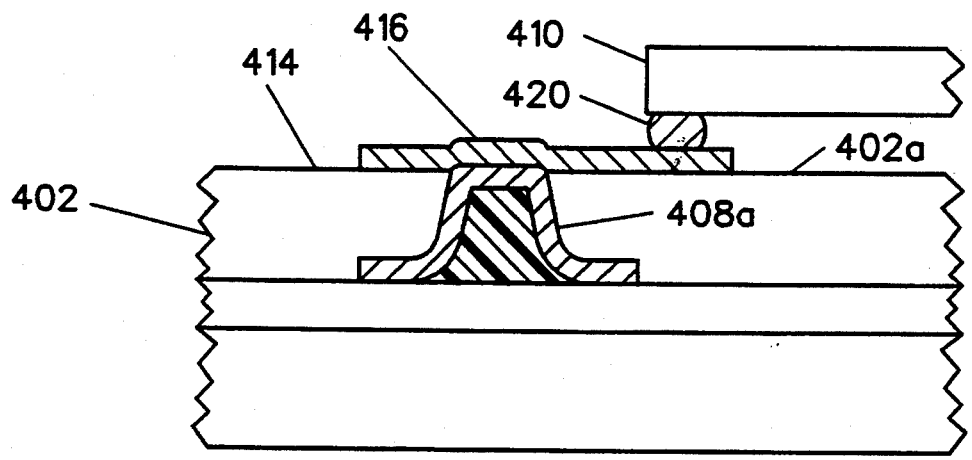
FIG. 4a shows another embodiment of a substrate for flip-chip assembly, according to the invention, with a semiconductor die bump bonded thereto.
Figure 4B:
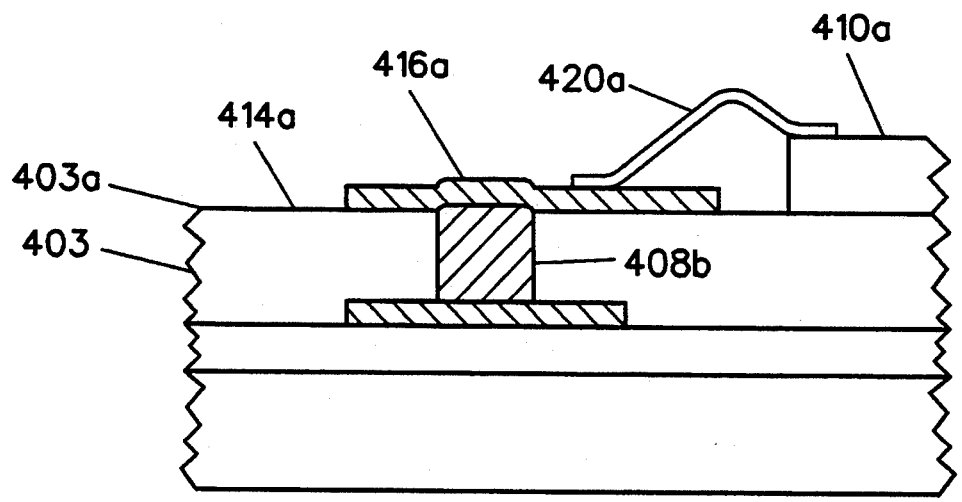
FIG. 4b shows another embodiment of a substrate for flip-chip assembly, according to the invention, with a semiconductor die mounted and connected thereto using conventional wire bond techniques.

FIGS. 4a and 4b illustrate still another technique, according to the invention, whereby the tops of the pillar structures, or raised portions of the first metal layer, are permitted to protrude slightly through the surface of insulating layer between the two metal layers. The second metal layer is formed over the surface of the insulating layer and over the pillar protrusions thereby forming electrical connections between the pillars and the second metal layer. These Figures also illustrate the application of the completed multi-layer substrate for multi-chip module, whereby integrated circuit dies (a portion of one die is shown) are mounted and connected to one another via the multi-layer substrate.

FIG. 4a shows a wiring substrate 402, where a pillar structure 408a is formed such that the top of the raised portion of the metal layer 408 (akin to 108) protrudes slightly above the surface 402a of the insulating layer (akin to 110). In this case, the pillar structure is formed by the "push-up" technique described hereinabove with respect to FIGS. 1a–1c. A second metal wiring layer 414 is formed over the surface 402a of the wiring substrate 402 by any suitable technique. The second metal wiring layer 414 extends over and contacts the protruding portion of the raised portion of the conductor 408, resulting in an electrical connection between the raised portion of the conductor 408 of the first wiring layer and the second metal wiring layer 414. The second metal wiring layer 414 provides a connection point whereby a semiconductor die 410 can be flip-chip mounted to the wiring substrate 402. In this case, the die 410 is mounted to the substrate 402 by means of a solder ball connection 420 (presumably there are many others) between the die 410 and the second metal wiring layer 414.

FIG. 4b shows a similar wiring substrate 403, where a pillar structure 408b is formed such that the pillar structure 408b atop a wiring layer (akin to 208) protrudes slightly from the surface 403a of the wiring substrate 403. In this case, the pillar structure 408b is formed as a conductive structure disposed on top of a first metal wiring layer (akin to 206), as described hereinabove with respect to FIGS. 2a–2c. A second metal wiring layer 414a is formed over the surface 403a of the wiring substrate 403 by any suitable technique. The second metal wiring layer 414a extends over and contacts the protrusion of the pillar structure 408b, thereby forming an electrical connection between the pillar structure and the second metal wiring layer 414a. The second metal wiring layer 414a provides a connection point whereby a semiconductor die 410a can be connected to the wiring substrate 403. In this case, the die 410a is mounted by adhering its back surface to the surface 403a of the substrate 403. An electrical connection is formed between the die 410a and the second metal wiring layer 414a by means of a bond wire.

What is claimed is:

1. A method of fabricating a heat dissipating wiring substrate for multi-chip modules, comprising:
providing a base layer;
forming a plurality of thermally conductive pillar structures on a surface of the base layer;
forming a first metal wiring layer over the surface of the base layer, said wiring layer having a plurality of conductors, pushed-up portions of the conductors extending over the plurality of thermally conductive pillar structures;
forming an insulating layer over the first metal wiring layer;
forming a second metal wiring layer over the insulating layer; and
forming electrical connections between the second metal wiring layer and the pushed up portions of the conductors.

2. A method, according to claim 1, wherein:
the base layer is formed of polyimide.

3. A method, according to claim 1, wherein the insulating layer is formed of polyimide.

4. A method, according to claim 1, wherein:
the pillar structures are formed of an electrically conductive material.

5. A method according to claim 1, wherein:
the pillar structures are formed of an electrically non-conductive material.

6. A method according to claim 1, wherein:
the insulating layer is formed such that top surfaces of the pushed-up portions of the conductors protrude from a top surface of the insulating layer.

7. A method according to claim 1, wherein:
the insulating layer is formed such that top surfaces of the pushed-up portions of the conductors are flush with a top surface of the insulating layer.

8. A method according to claim 1, wherein:
the insulating layer is formed such that top surfaces of the pushed-up portions of the conductors are buried within a top surface of the insulating layer.

9. A method, according to claim 8, further comprising:
forming shallow vias into the top surface of the insulating layer, aligned with the pushed-up portions of the conductors, prior to forming the second metal wiring layer.

10. A method of fabricating a wiring substrate for multichip modules, comprising:
providing a base layer;
forming a first metal wiring layer over the surface of the base layer, said wiring layer having a plurality of conductors;
forming a plurality of electrically-conductive pillar structures on the plurality of conductors;
forming an insulating layer over the first metal wiring layer;
forming a second metal wiring layer over the insulating layer; and
forming electrical connections between the second metal wiring layer and the electrically-conductive pillar structures.

11. A method, according to claim 10, wherein:
the base layer is formed of polyimide.

12. A method, according to claim 10, wherein the insulating layer is formed of polyimide.

13. A method according to claim 10, wherein:
the insulating layer is formed such that top surfaces of the pushed-up portions of the conductors protrude from a top surface of the insulating layer.

14. A method according to claim 10, wherein:
the insulating layer is formed such that top surfaces of the pushed-up portions of the conductors are flush with a top surface of the insulating layer.

15. A method according to claim 10, wherein:
the insulating layer is formed such that top surfaces of the pushed-up portions of the conductors are buried within a top surface of the insulating layer.

16. A method, according to claim 15, further comprising:
forming shallow vias into the top surface of the insulating layer, aligned with the pushed-up portions of the conductors, prior to forming the second metal wiring layer.

17. A heat dissipating substrate, comprising:
a base layer;
a first metal layer having a first plurality of conductors disposed on the base layer;
an insulating layer disposed on the first metal layer;
a second metal layer having a second plurality of conductors disposed on the insulating layer;
thermally conductive pillar structures disposed on the base layer, underneath the first plurality of conductors causing portions of the first plurality of conductors to be pushed-up through the insulating layer towards the second plurality of conductors: and
connections between the first metal layer and the second metal layer formed through the insulating layer.

* * * * *